(12) United States Patent
Hsu

(10) Patent No.: US 7,149,083 B2
(45) Date of Patent: Dec. 12, 2006

(54) HEAT DISSIPATION STRUCTURE

(76) Inventor: Hul-Chun Hsu, 6F-3, No. 422, Sec. 2, Li-Ming Rd., Taichung (TW)

( * ) Notice: Subject to any disclaimer, the term of this patent is extended or adjusted under 35 U.S.C. 154(b) by 112 days.

(21) Appl. No.: 10/792,699

(22) Filed: Mar. 5, 2004

(65) Prior Publication Data

US 2005/0195569 A1    Sep. 8, 2005

(51) Int. Cl.
*H05K 7/20* (2006.01)
(52) U.S. Cl. ............... 361/697; 361/700; 361/704; 361/710; 165/80.3; 165/104.33; 257/719; 257/722
(58) Field of Classification Search ........... 361/687, 361/694–697, 700, 701–719; 257/718–719, 257/722–727; 165/80.3, 104.21, 125, 185, 165/121, 104.33, 104.26; 174/16.3
See application file for complete search history.

(56) References Cited

U.S. PATENT DOCUMENTS 6,382,306 B1 *   5/2002   Hsu ..................... 165/80.3
6,816,373 B1 *  11/2004   Lee et al. ............... 361/697
6,851,467 B1 *   2/2005   Bamford et al. ......... 165/80.3
6,860,321 B1 *   3/2005   Ji-Hai et al. ............ 165/80.3
2005/0073811 A1*  4/2005   Wang et al. ............. 361/688

* cited by examiner

*Primary Examiner*—Michael Datskovskiy

(57) ABSTRACT

A heat dissipation structure installed on a computer central processing unit or a heat generating device, has a thermal conductive base, at least one heat pipe and a heat sink. The thermal conductive base has a supporting part and a first interlocking part. The supporting part allows the heat pipe mounted thereon. The heat sink has a plurality of fins configured with a receiving slot and a second interlocking part. The second interlocking part is engaged with the first interlocking part, while the receiving slot and the supporting part of the thermal conductive base enclose the heat pipe therein to form the heat dissipation structure. By the connection between the thermal conductive pipe and the heat sink, the contact intensity between various devices is increased, such that the heat conduction performance is improved.

13 Claims, 8 Drawing Sheets

HEAT DISSIPATION STRUCTURE

BACKGROUND OF THE INVENTION

The present invention relates in general to a heat dissipation structure, and more particularly, to a heat dissipation structure that improves heat conduction performance by increasing contact intensity between various elements.

In the past, the operation speed of the computer central processing unit was so slow that installation of a heat dissipation fan along is sufficient to dissipate heat generated thereby. However, as the clock pulse of central processing unit developed lately has exceeded 3 GHz, the heat generated thereby is proportionally increased. However, the design of heat dissipation device is generally restricted by limited space within the computer. Therefore, how to effectively dissipate heat generated by the central processing unit has become an important topic in computer industry.

FIG. 1 shows a conventional heat dissipation structure, which includes a thermal conductive base 10a, two heat pipes 20a and a heat sink 30a. The thermal conductive base 10a is attached to a top surface of the central processing unit. Two channels 11a are formed on the top surface of the thermal conductive base 10a. The channels 11a allow one portion of a heat pipe 20a embedded therein, while the other portion of the heat pipe 20a is inserted into a heat sink 30a. The heat sink 30a is constructed of a stack of fins 31a. Holes 32a are formed through the fins 31a allowing the other portion of the heat pipe 20a inserted through. Thermal conductive medium is coated on contact surfaces of the above elements to form a heat pipe heat dissipation device.

The conventional heat pipe dissipation structure has the following drawbacks.

1. As each of the heat pipes 20a is in the form of a thin elongate cylindrical tube, the space for installing wick structure and working fluid is very limited. The contact surface between the heat pipe 20a and the thermal conductive base 10a and the heat sink 30a is very small, such that the heat resistance is large. Therefore, the heat to be dissipated by such structure is very limited.

2. The holes 32a through the fins 31a are in the form of circular holes, such that it is difficult to apply the glue-like thermal conductive medium for connecting the heat pipe 20a with the fins 31a thereon. Therefore, a good contact cannot be obtained.

3. The flow channel of the heat pipe dissipation device is not a streamline flow, such that when the fan generated downward air flow, impact is caused between the air flow and the flow channel of the heat pipe. As a result, the flow resistance, number of turbulences and noise are increased, and the thermal convection coefficient is greatly affected.

To resolve the problems caused by the conventional heat dissipation device as described above, the Applicant, with many years of experience in this field, has developed a coffee and water dispenser as described as follows.

BRIEF SUMMARY OF THE INVENTION

The present invention provides a heat dissipation structure which uses interlock between a thermal conductive base and a heat sink to increase contact intensity and reduce thermal resistance. Further, as the conductive medium can be uniformly coated on the supporting part and the receiving slot, a heat dissipation structure with lower flow resistance and improved thermal conduction is obtained.

The heat dissipation structure provided by the present invention is suitably applied on top of a computer processing unit or a heat generating device. The heat dissipation structure comprises a thermal conductive base, at least one heat pipe and a heat sink. The thermal conductive base includes a supporting part and a first interlocking part. The heat pipe is disposed in the supporting part. The heat sink includes a plurality of fins stacked with each other. The heat sink is configured with a receiving slot and a second interlocking part to be engaged with the first interlocking part. Thereby, the heat pipe is wrapped within the thermal conductive base and the heat sink, such that the contact intensity is improved, and the heat dissipation performance is improved.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These, as well as other features of the present invention, will become apparent upon reference to the drawings wherein.

DETAILED DESCRIPTION OF THE INVENTION

Figure 1:
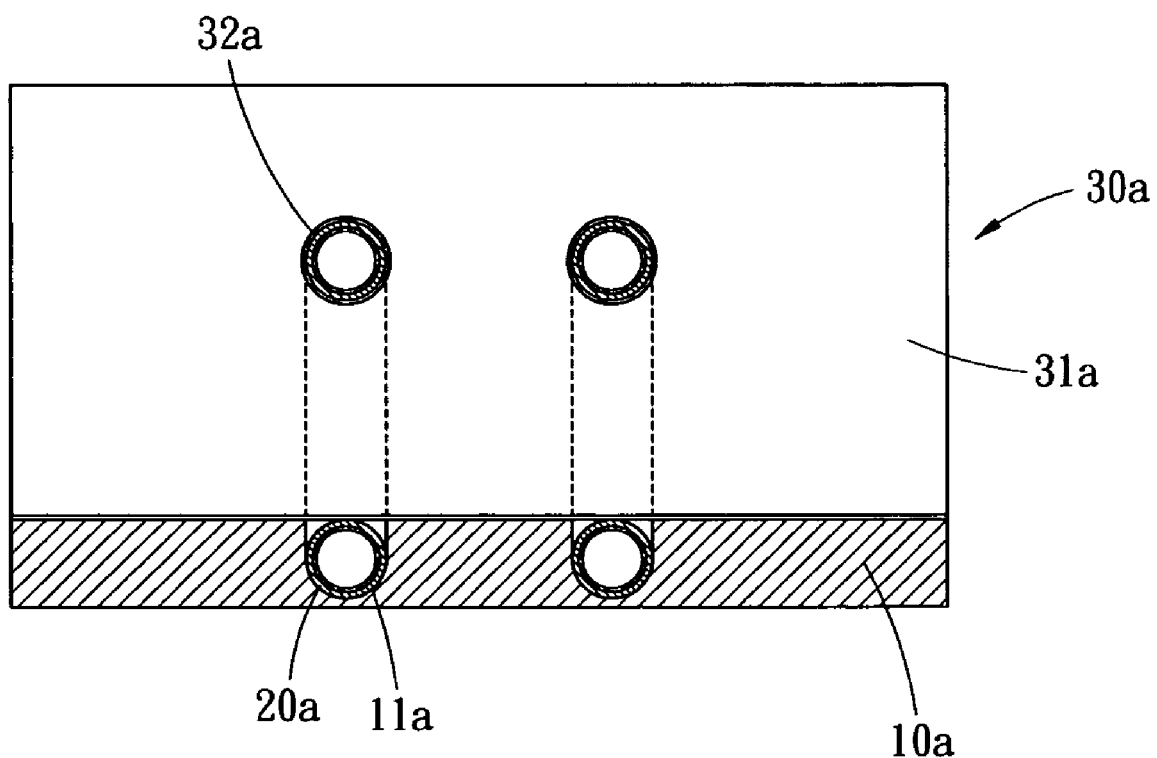
FIG. 1 shows a conventional heat dissipation structure.
Figure 2:
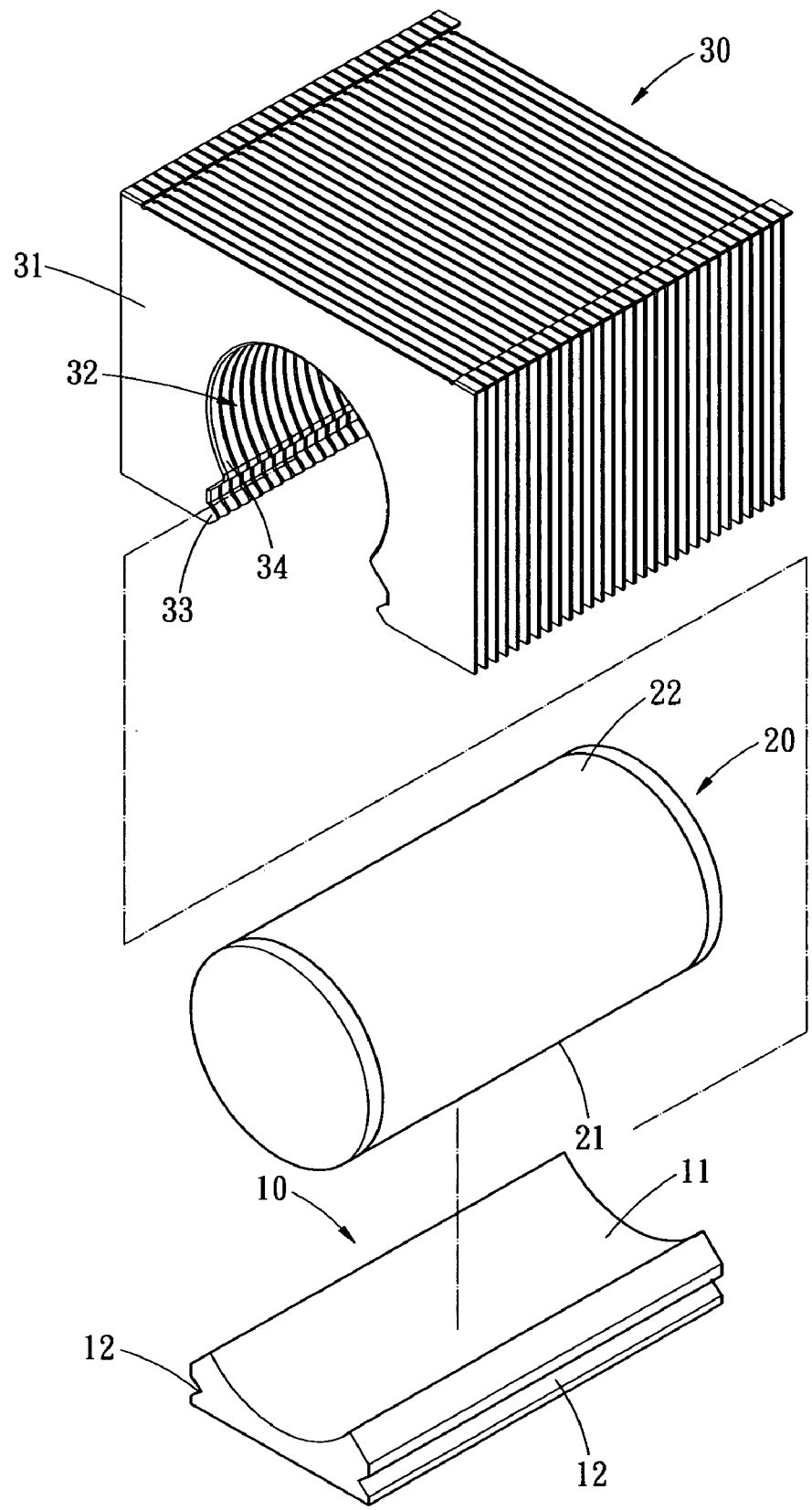
FIG. 2 shows a perspective view of a heat dissipation structure provided in a first embodiment of the present invention.
Figure 3:
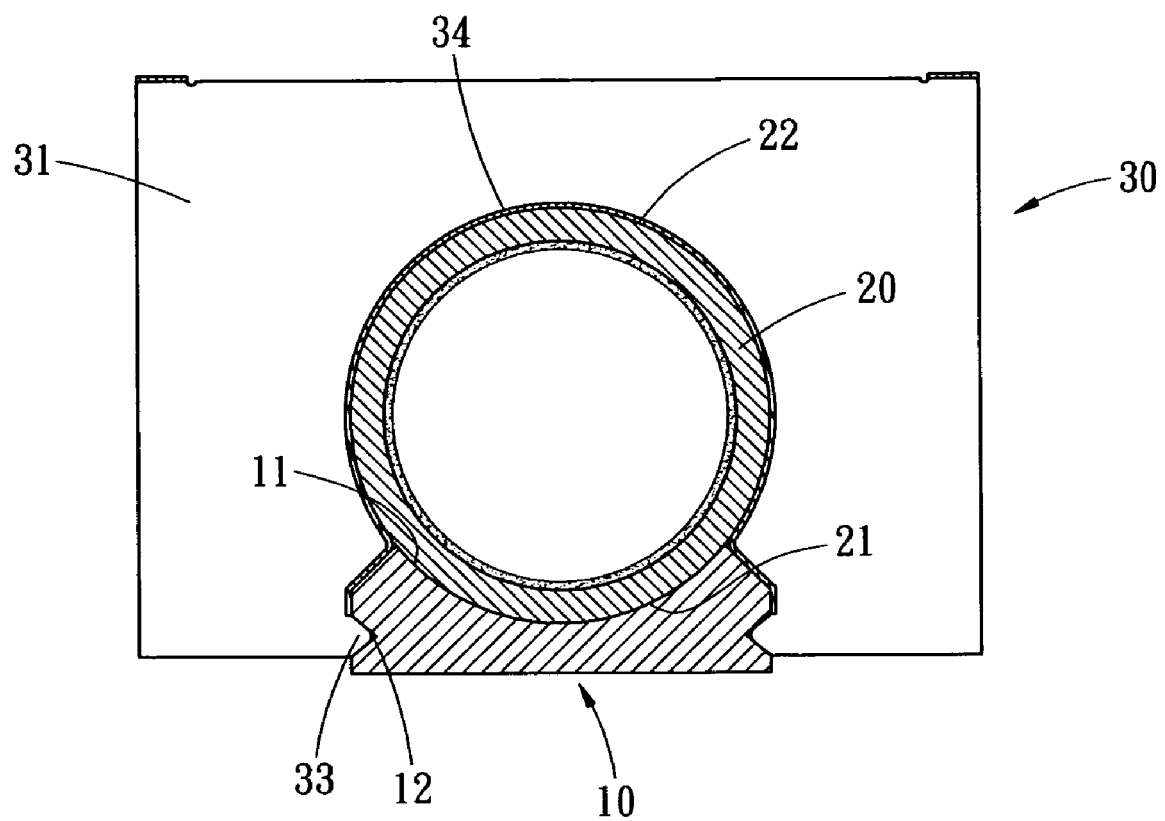
FIG. 3 shows a cross sectional view of the heat dissipation structure.

Referring now to the drawings wherein the showings are for purpose of illustrating preferred embodiments of the present invention only, and not for purposes of limiting the same. As shown in FIGS. 2 and 3, the present invention provides a heat dissipation structure including a thermal conductive base 10, a heat pipe 20 and a heat sink 30.

The thermal conductive base 10 is preferably fabricated from conductive material such as aluminum or copper, for example. The top surface of the thermal conductive base 10 is contoured with a curve-shape supporting part 11. The supporting part 11 is in the form of an open seat allowing thermal conductive paste such as tin paste to be uniformly coated thereon. Each side surface of the supporting part 11 includes a recessed groove or a protruding hook to serve as a first interlocking part 12. In this embodiment, a V-shape recessed groove is formed to serve as the first interlocking part 12.

The heat pipe 12 includes a cylindrical pipe with a large diameter. Wick structure and working fluid are formed in the heat pipe 20 to facilitate thermal conduction mechanism, such that heat generated by a heat source can be instantly dissipated away. The heat pipe 12 is attached to the thermal conductive base 10 on the supporting part 11. The heat pipe 12 includes a heat absorption end 21 and a heat dissipation end 22. The contact area between the heat absorption end 21 and the thermal conductive base 10 includes the top surface of the supporting part 11.

The heat sink 30 is preferably fabricated from conductive material such as aluminum or copper. In this embodiment, the heat sink 30 includes a plurality of fins 31 stacked with each other. Each of the fins 31 includes an opening recessed from one side thereof, and each of the openings includes an upper portion and a lower portion. When the fins 31 are stacked together to form the heat sink 30, the openings are aligned with each other to form a receiving slot 32 of the heat pipe 20 and a second interlocking part 33 to be engaged with the first interlocking part 12. The receiving slot 32 is conformal to the cross section of the exposed portion of the heat pipe 20 attached on the thermal conductive base 10, and the second interlocking part 12 is configured complementary to the surface configuration of the first interlocking part 12. Therefore, the heat pipe 20 can be encircled within the heat sink 30 and the thermal conductive base 10 as shown in FIG. 3. The heat sink 30 may further includes a linen 34 extending from the surface of an upper portion of the second interlocking part 33 throughout the whole surface of the receiving slot 32 to increase contact area between the heat sink and the heat pipe 20, so as to result in a uniform coating of thermal conductive medium coated thereon.

Figure 4:
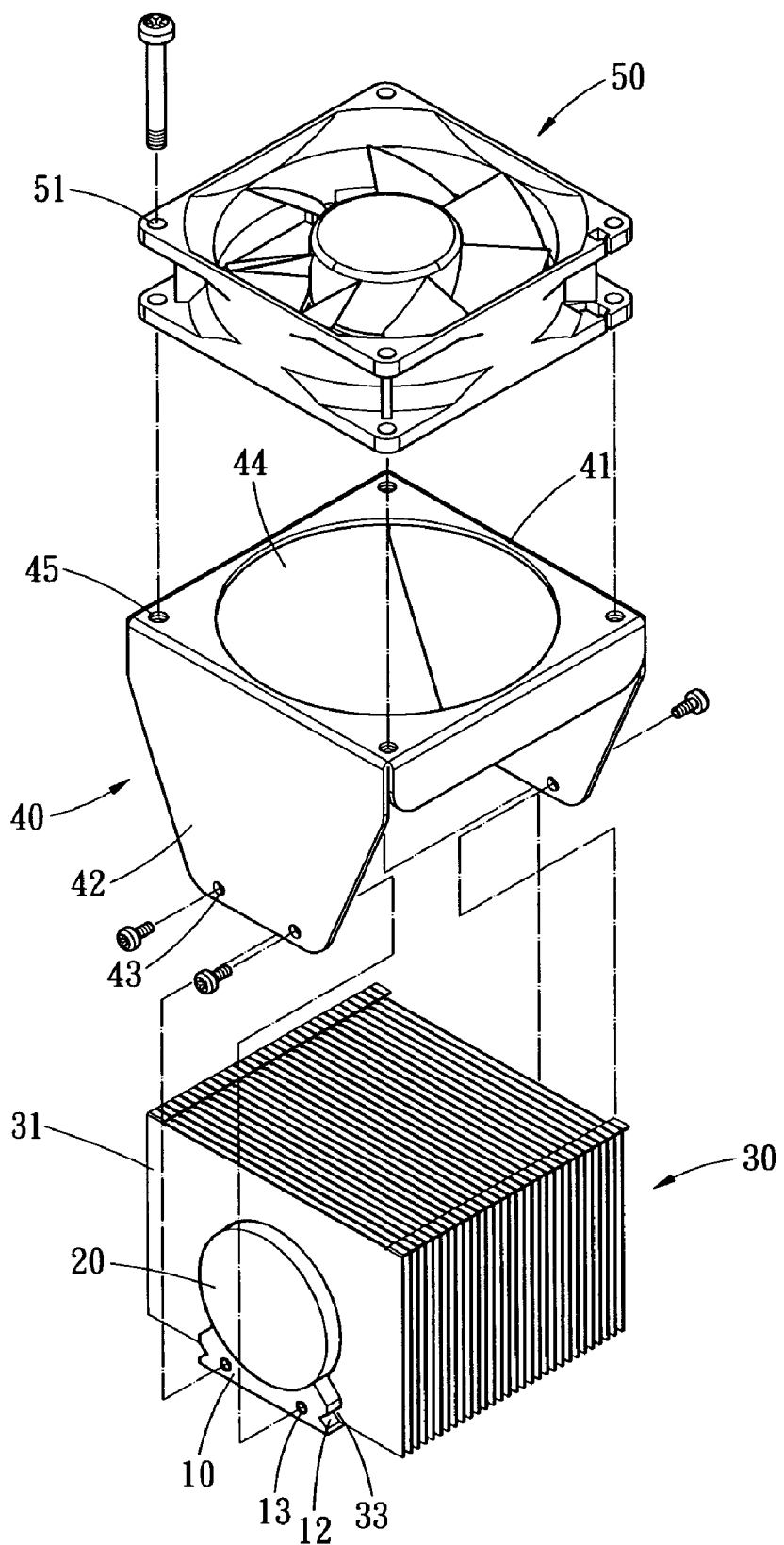
FIG. 4 shows an exploded view of an assembly of the heat dissipation structure and a heat dissipation fan.
Figure 5:
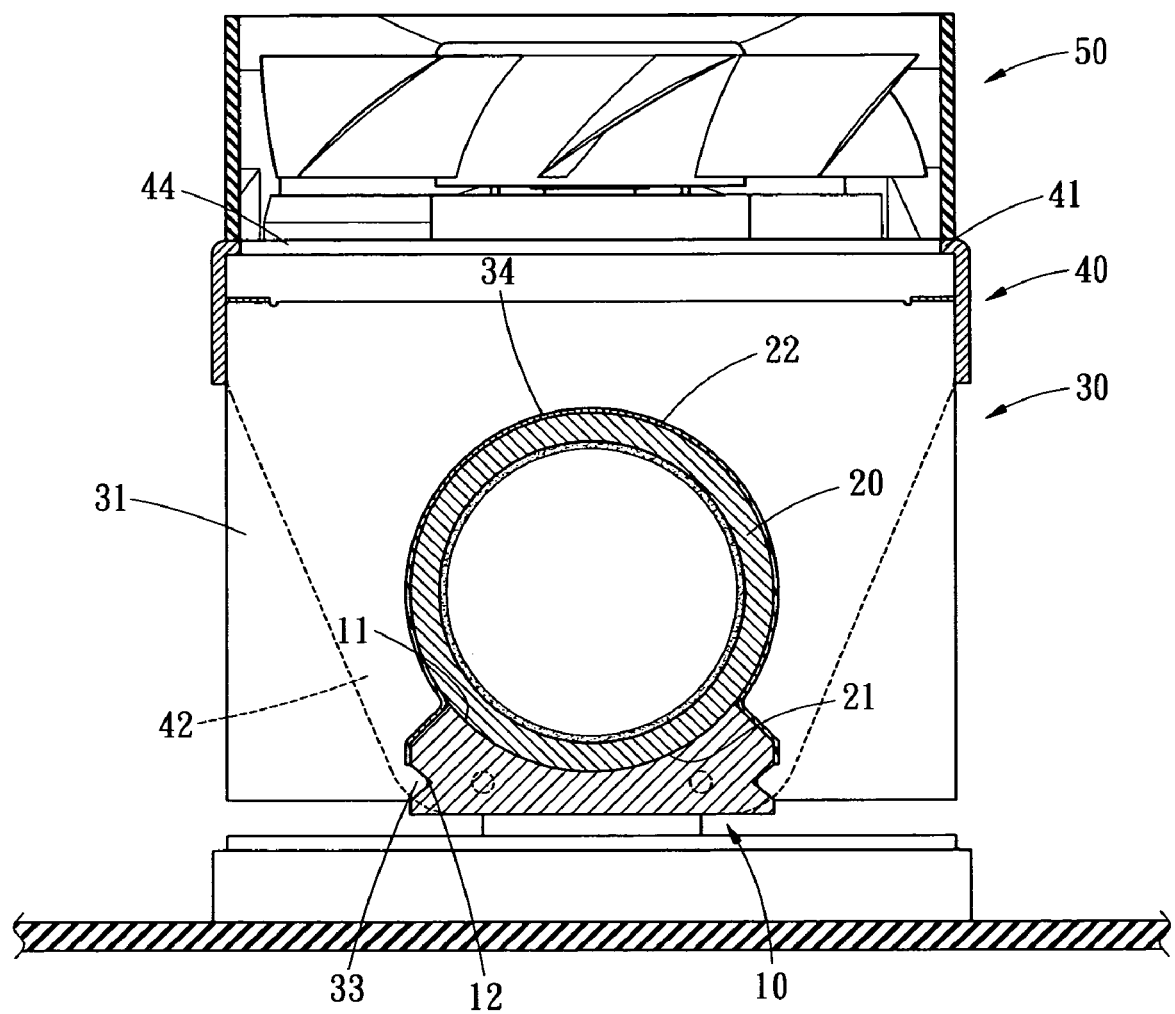
FIG. 5 shows a cross sectional view of FIG. 4.
Figure 6:
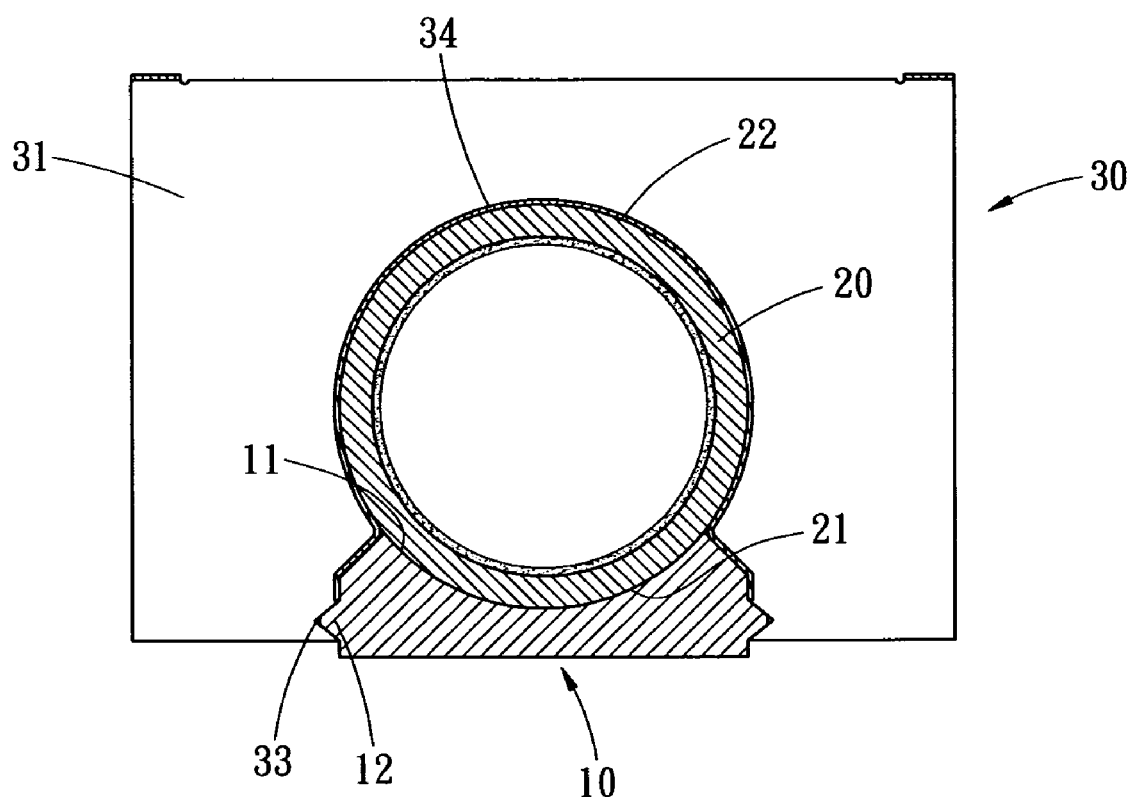
FIG. 6 shows a cross sectional view of a heat dissipation structure provided in a second embodiment of the present invention.

FIGS. 4 and 5 show the heat dissipation structure assembled with and a fan 50 by a fitting seat 40. As shown, the fitting seat 40 includes two opposing side plates 42 and a top plate 41 adjacent to the side plates 42. The top plate 41 is perforated with a large opening 44 to expose a majority portion of the heat sink 30 and the blades of the fan 50. Preferably, the fitting seat 40 is mounted over the heat sink 30. The lower edges of the side plates 42 includes a pair of through holes 43 to be aligned with two threaded holes formed on opposing end surfaces of the thermal conductive base 10. Therefore, by two pair of screws, the side plates 42 are attached to two ends of the thermal conductive base 10. The top plate 41 further comprises a plurality of through holes formed on four corners thereof, and each corner of the fan 50 may includes a through hole allowing a screw threaded through and engaged with the holes 45. Therefore, the fan 50 is secured on top of the heat dissipation structure.

Figure 7:
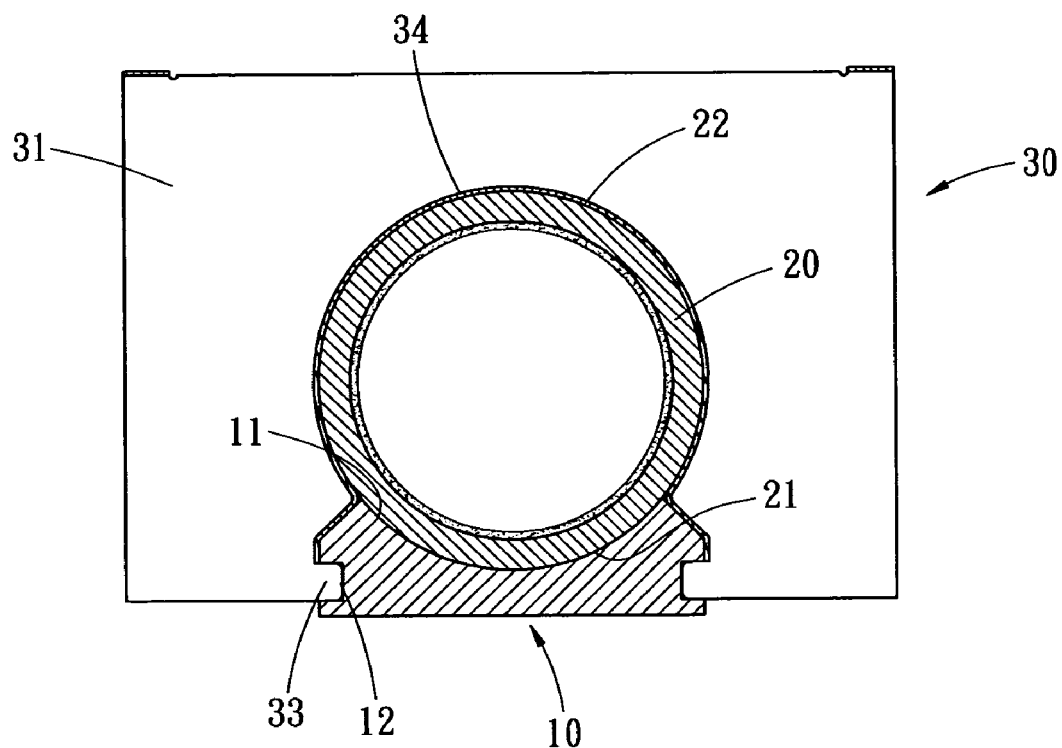
FIG. 7 shows a cross sectional view of a heat dissipation structure provided in a third embodiment of the present invention.
Figure 8:
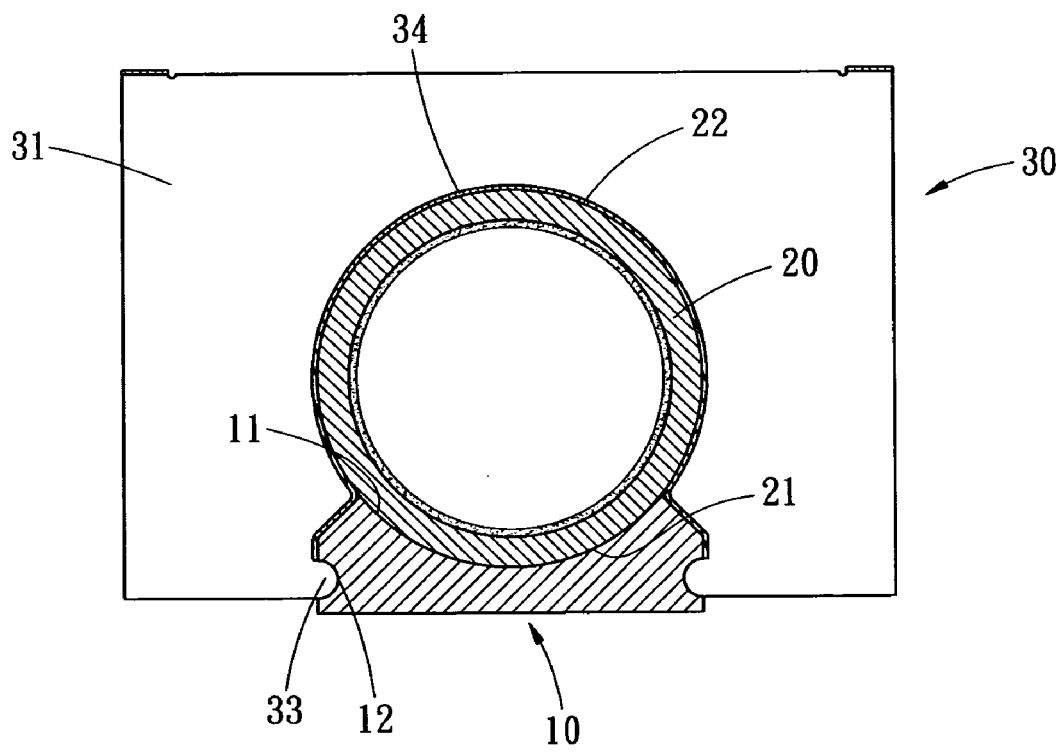
FIG. 8 shows a cross sectional view of a heat dissipation structure provided in a fourth embodiment of the present invention.
Figure 9:
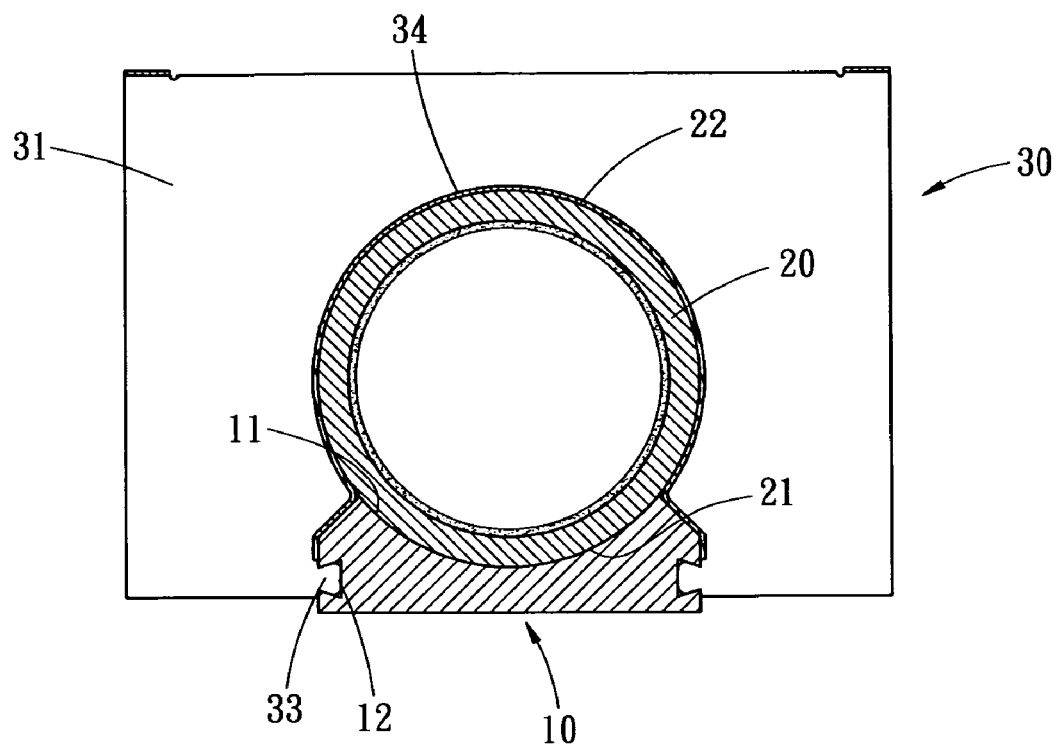
FIG. 9 shows a cross sectional view of a heat dissipation structure provided in a fifth embodiment of the present invention.
Figure 10:
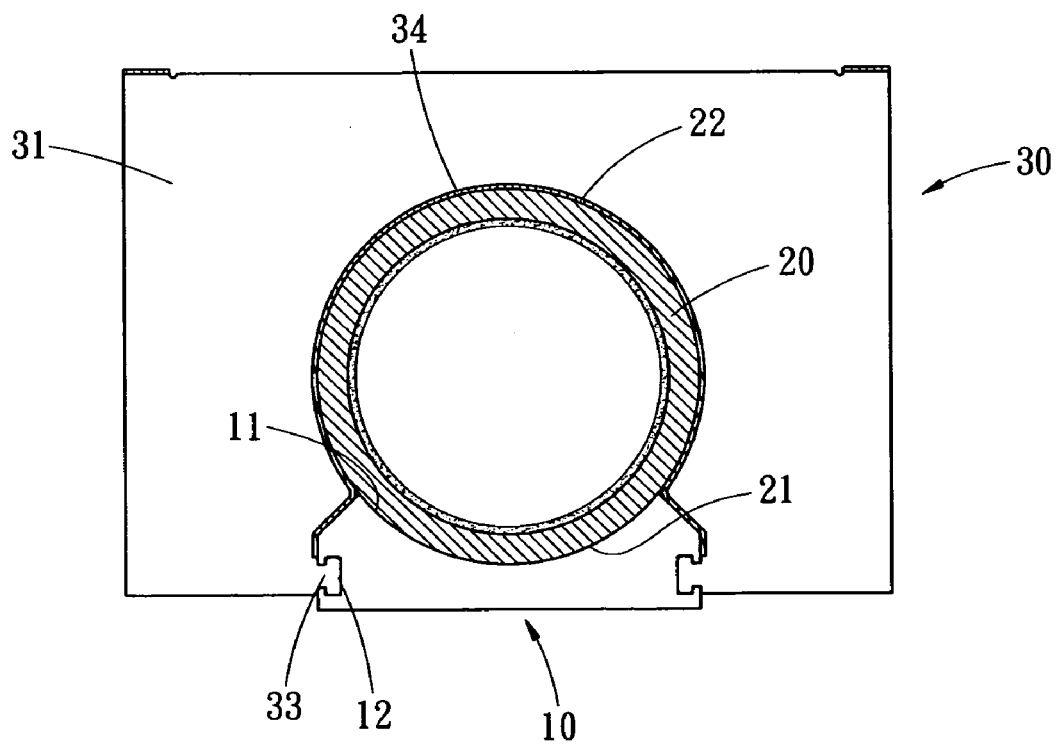
FIG. 10 shows a cross sectional view of a heat dissipation structure provided in a sixth embodiment of the present invention.

FIGS. 7 to 10 illustrate cross sectional views of various embodiments of the present invention. In FIG. 7, the first and second interlocking parts 12 and 33 are a pair of rectangular recessed channel and protruding bar. In FIG. 8, semicircular cross section of the first and second interlocking parts 12 and 33 is formed. In FIG. 9, dovetail cross section is formed, and in FIG. 10, T shape is configured. The above structures allow the thermal conductive base 10 and the heat sink 30 to be attached to or detached from each other laterally only.

Accordingly, the heat dissipation structure provided by the present invention provides a large open area for uniformly coating thermal conductive medium, such that thermal resistance between the heat pipe and the thermal conductive base is effectively reduced. The thermal conductive medium can also be uniformly coated along the exposed surface of the heat pipe or the surface of the receiving slot of the heat sink, the thermal resistance is further reduced.

Further, the first and second interlocking parts prevent the fins to be deformed during assembly and increase contact area and contact intensity between the thermal conductive base, the heat sink and the heat pipe. In addition, the size of the heat pipe is large enough to provide efficient heat conduction. Further, a streamline configuration is obtained to reduce resistance and noise of air flow.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A heat dissipation structure, comprising:
   a thermal conductive base, comprising:
      partially cylindrical top surface extending between two opposing ends of the thermal conductive base;
      a first interlocking member formed along two elongate sidewalls of the thermal conductive base, the first interlocking member extending between the two opposing ends;
   a heat pipe, with a portion of a cylindrical surface fitted to and disposed on the top surface; and
   a heat sink, comprising an opening recessed from a bottom surface thereof, wherein the opening includes:
   a receiving slot; and
   a second interlocking part extending downwardly from the receiving slot, the second interlocking part being configured to be engaged with the first interlocking part so that the heat pipe is received in between the receiving slot and the top surface.

2. The structure of claim 1, wherein the first interlocking part includes a pair of protrusions extending along the sidewalls, and the second interlocking part includes a pair of recessed grooves extending between two opposing ends of the heat sink.

3. The structure of claim 2, wherein the first and second interlocking parts have V cross sections.

4. The structure of claim 2, wherein the first and second interlocking parts have semicircular cross sections.

5. The structure of claim 2, wherein the first and second interlocking parts have dovetail cross sections.

6. The structure of claim 2, wherein the first and second interlocking parts have T cross sections.

7. The structure of claim 1, wherein the heat sink includes a plurality of fins stacked with each other.

8. The structure of claim 1, wherein the receiving slot has a cross sectional conformal to cross section of an exposed portion of the heat pipe attached on the top surface of the thermal conductive base.

9. The structure of claim 1, wherein the heat pipe includes a heat absorption end in contact with the thermal conductive base and a heat dissipation end in contact with the heat sink.

10. The structure of claim 1, wherein the receiving slot has a cross section larger than one half of the cross section of the heat pipe.

11. The structure of claim 1, further comprising a fan mounted over the heat sink by a fitting seat.

12. The structure of claim 11, wherein the fitting seat includes two opposing end plates fastened to the opposing ends of the thermal conductive base.

13. The structure of claim 11, wherein the fitting seat includes a top plate perforated with an opening.

* * * * *